US011753843B2

(12) United States Patent
Yu et al.

(10) Patent No.: US 11,753,843 B2
(45) Date of Patent: Sep. 12, 2023

(54) VALVE TOWER REINFORCING STRUCTURE AND REINFORCING METHOD

(71) Applicants: NR ENGINEERING CO., LTD., Jiangsu (CN); NR ELECTRIC CO., LTD., Jiangsu (CN)

(72) Inventors: Haibo Yu, Jiangsu (CN); Xiaobo Zhang, Jiangsu (CN); Biao Gao, Jiangsu (CN); Bin Liu, Jiangsu (CN); Chenxi Ren, Jiangsu (CN); Weiwei Zhang, Jiangsu (CN)

(73) Assignees: NA ENGINEERING CO., LTD., Nanjing (CN); NR ELECTRIC CO., LTD., Nanjing (CN)

( * ) Notice: Subject to any disclaimer, the term of this patent is extended or adjusted under 35 U.S.C. 154(b) by 160 days.

(21) Appl. No.: 17/293,333

(22) PCT Filed: Feb. 26, 2020

(86) PCT No.: PCT/CN2020/076821
§ 371 (c)(1),
(2) Date: May 12, 2021

(87) PCT Pub. No.: WO2020/233183
PCT Pub. Date: Nov. 26, 2020

(65) Prior Publication Data
US 2022/0010576 A1 Jan. 13, 2022

(30) Foreign Application Priority Data
May 20, 2019 (CN) .......................... 201910419183.3

(51) Int. Cl.
*E04H 12/10* (2006.01)
*E04H 12/34* (2006.01)
*H02J 3/36* (2006.01)

(52) U.S. Cl.
CPC ............. *E04H 12/10* (2013.01); *E04H 12/34* (2013.01); *H02J 3/36* (2013.01)

(58) Field of Classification Search
CPC ............ E04H 12/10; E04H 12/34; H02J 3/36; H02M 7/003; H05K 7/1432; Y02E 60/60
(Continued)

(56) References Cited

U.S. PATENT DOCUMENTS 4,710,850 A 12/1987 Jahn et al.

FOREIGN PATENT DOCUMENTS

| CN | 203645559 U | 6/2014 |
| CN | 104953858 A | 9/2015 |

(Continued)

OTHER PUBLICATIONS

International Search Report issued for PCT/CN2020/076821 dated Jun. 8, 2020.
(Continued)

*Primary Examiner* — Andrew J Triggs
(74) *Attorney, Agent, or Firm* — MagStone Law, LLP; Enshan Hong

(57) ABSTRACT

The present invention provides a reinforcing structure and method for reinforcing valve towers, mainly aiming at valve towers with three or more layers, wherein the four corners of the side face of each layer of a valve section of the valve tower are provided with connecting flanges, and connecting rods are used for connecting the corresponding connecting flanges of adjacent valve towers of the same bridge arm to realize lateral reinforcing. The connection modes of lateral reinforcing mainly include horizontal connection, interleaving connection and cross-layer connection. The invention provides various reinforcing solutions for flexible DC valve towers in the environment of long-term turbulence and strong vibrations, the reinforcing structure is simple and
(Continued)

effective, high in reliability and operability, and easy to disassemble, and the stability and safety of the valve towers during transportation and operation are enhanced.

4 Claims, 3 Drawing Sheets

(58) Field of Classification Search
USPC .................................................. 52/651.02
See application file for complete search history.

(56) References Cited

FOREIGN PATENT DOCUMENTS

| CN | 105207498 | A | | 12/2015 | | |
|---|---|---|---|---|---|---|
| CN | 106998130 | A | | 8/2017 | | |
| CN | 107900960 | A | | 4/2018 | | |
| CN | 207588444 | U | | 7/2018 | | |
| CN | 108667060 | A | | 10/2018 | | |
| CN | 108923345 | A | * | 11/2018 | ............... | H02G 3/03 |
| CN | 108923345 | A | | 11/2018 | | |
| CN | 208433759 | U | | 1/2019 | | |
| JP | 108266055 | A | | 10/1996 | | |
| KR | 20140130316 | A | | 11/2014 | | |

OTHER PUBLICATIONS

Written Opinion issued for PCT/CN2020/076821 dated Jun. 8, 2020.
Chinese Application No. 201910419183.3, First Office Action and Search Report dated Aug. 18, 2021, 21 pages.
European Application No. 20809182.7, Extended European Search Report dted Dec. 21, 2021, 8 pages.
Chinese Application No. 201910419183.3, Second Office Action dated Jan. 13, 2022, 16 pages.

* cited by examiner

VALVE TOWER REINFORCING STRUCTURE AND REINFORCING METHOD

RELATED APPLICATIONS

This is a U.S. national stage of international application No. PCT/CN2020/076821 filed on Feb. 26, 2020, which claims priority to Chinese Patent Application No. 201910419183.3, filed with the China National Intellectual Property Administration (CNIPA) on May 20, 2019, the entire content of which is incorporated herein by reference.

TECHNICAL FIELD

The present invention belongs to the technical field of power equipment platform reinforcing, and particularly relates to a reinforcing structure and method for reinforcing valve towers.

BACKGROUND

With the continuous development of flexible DC technology and the gradual application of flexible DC technology in distribution networks in recent years, more and more flexible DC projects are emerging. Flexible DC transmission technology is developing towards high voltage, large capacitance and multi-terminal interconnection, and has been widely applied to distributed new energy access, power grid interconnection, urban power supply, offshore platforms and island power supply, etc. At the same time, new requirements are put forward for the structural design of flexible DC valve towers. General flexible DC valve towers have four to five floors, can be a dozen meters high and weigh dozens of tons. During transportation and operation, the flexible DC valve towers may encounter complex working conditions, such as wind loads, wave loads, current loads and ice loads, even earthquakes. In order to ensure the safety and reliability of large-scale power equipment during transportation or operation, reinforcing is necessary, so that the influence of the natural environment on the strength of power equipment can be controlled, and the service life of platform structures can be prolonged.

Therefore, it is necessary to develop a new reinforcing structure for valve towers, to provide various reinforcing solutions for complex situations such as wind loads, wave loads, and transportation vibrations that the valve towers may encounter during transportation and operation.

The contents of the background art are only the technology known by the inventor, and do not necessarily represent the prior art in the art.

SUMMARY

In view of this, the technical problem to be solved by the present invention is to provide a reinforcing structure for a valve tower, which makes the connection and reinforcement between adjacent valve towers simple, effective and highly reliable through the cooperation of connecting flanges and connecting rods, so as to enhance the stability and safety of the valve towers during transportation and operation.

To some extent, any aspect or feature described herein can be used together with any or all of other aspects and features described herein.

According to one aspect of the invention, a reinforcing structure for a valve tower is provided. The valve tower comprises a plurality of layers of valve sections. The reinforcing structure comprises:

a plurality of connecting flanges being arranged at top corners of the layers of valve sections, respectively; and connecting rods, two ends of each connecting rod being connected to the connecting flanges on the adjacent valve towers respectively, so as to reinforce the adjacent valve towers.

According to one aspect of the invention, the connecting modes of the adjacent valve towers comprise horizontal connection, interleaving connection and cross-layer connection.

According to one aspect of the invention, the horizontal connection means that the connecting flanges at corresponding heights of the corresponding layers of valve sections of the adjacent valve towers are connected to each other, either on the same side or on different sides, and each of the connecting rod is horizontal.

According to one aspect of the invention, the interleaving connection means that for each two adjacent valve towers, the two connecting flanges at the bottom of one side of one layer of valve section on one of said two adjacent valve towers are connected with two connecting flanges at the top of a corresponding side of a next layer of valve section on the other of said two adjacent valve towers.

According to one aspect of the invention, the cross-layer connection means that for each two adjacent valve towers, two connecting flanges at the bottom of one side of one layer of valve section on one of said two adjacent valve towers are connected with two connecting flanges at the top of the corresponding side of the one below a next layer of valve section on the other of said two adjacent valve towers.

According to one aspect of the invention, in the interleaving connection mode, the corresponding connecting flanges at the top of the uppermost layer of valve section of a valve tower are connected with corresponding connecting flanges at the bottom of the lowermost layer of valve section of the adjacent valve tower by the horizontal connection.

According to one aspect of the invention, in the cross-layer connection mode, the connecting flanges at the top of the uppermost layer of valve section of a valve tower are connected with corresponding connecting flanges at the bottom of the lowermost layer of valve section of the adjacent valve tower by the horizontal connection, and the connecting flanges without corresponding connecting points across the layers are connected by the horizontal connection.

According to one aspect of the invention, the valve towers are two rows of valve towers arranged in a back-to-back mirror symmetry manner.

According to one aspect of the invention, the connecting rods are compressive or tensile.

According to one aspect of the invention, a method for reinforcing a valve towers is provided. Each of the valve towers comprises a plurality of layers of valve sections. The method comprises:

arranging connecting flanges at top corners of each layer of valve section of the valve tower; and connecting the connecting flanges through connecting rods, wherein the connection modes include horizontal connection, interleaving connection and cross-layer connection.

The invention has the beneficial effects that the adjacent valve towers are rigidly connected through the connecting flanges and the connecting rods, and a plurality of reinforcing connection modes which can be flexibly adopted according to different working conditions are provided for the valve towers in the environment with strong turbulence or vibrations. The reinforcing structure and method are simple, effective, high in reliability and operability, the reinforcing structure is easy to disassemble, and the stability and safety of the valve towers during transportation or under complex working conditions are enhanced.

DETAILED DESCRIPTION OF EMBODIMENTS

In order to make the object, technical solution and advantages of the present invention clearer, the present invention will be further explained in detail below according to the drawings and embodiments. It should be understood that the specific embodiments described here are only for explaining the present invention, and do not limit the present invention.

Many different implementations and embodiments disclosed below are used for a reinforcing structure and method for a valve tower of the present invention in different working conditions. In order to simplify the disclosure of the present invention, only specific implementations or examples will be described hereinafter. Therefore, they are only examples, and the description thereof is not intended to limit the present invention. In addition, any aspect or feature of any implementation or embodiment described below can be used together with any other implementation or embodiment if necessary.

As shown in FIGS. 1-6, a reinforcing structure for a valve tower is provided. The valve tower comprises a plurality of layers of valve sections. The reinforcing structure comprises:

a plurality of connecting flanges which are arranged at top corners of each layer of valve section respectively; and connecting rods, two ends of each connecting rod being connected to the connecting flanges on adjacent valve towers respectively to reinforce the adjacent valve towers.

Embodiment 1

Figure 1:
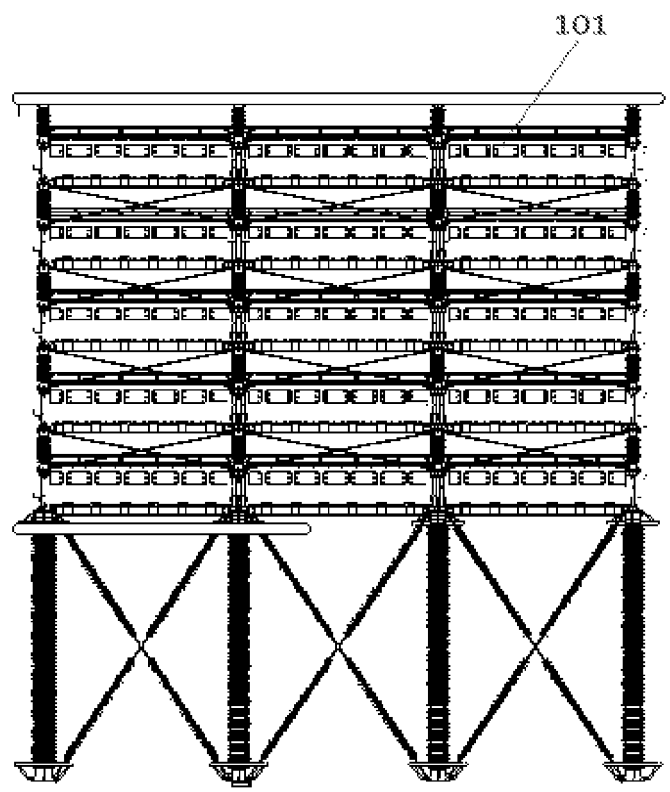
FIG. 1 is a front view of a valve tower according to the present invention.
Figure 2:
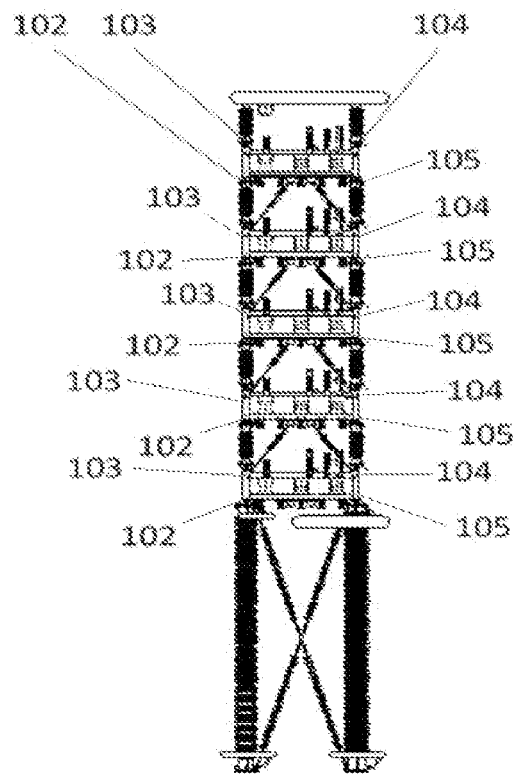
FIG. 2 is a side view of a valve tower according to the present invention.

As shown in FIGS. 1 and 2, taking a single-row valve tower as an example, the embodiment mainly describes the reinforcing connection solution of one side of the valve tower, and the other side adopts the same solution and will not be described any more. Connecting flanges 102, 103, 104 and 105 are arranged at four corners of one side of each layer of valve section 101 of the valve tower, wherein connecting flanges 102 and 105 are at the bottom of the layer of valve section, connecting flanges 103 and 104 are at the top of the layer of valve section, and the connecting flanges at the top corners of the side faces of each layer of valve sections are arranged at the same position.

According to different requirements of working conditions, adjacent valve towers are connected by the connecting flanges and the connecting rods in different specific connecting modes comprising horizontal connection, interleaving connection and cross-layer connection.

Figure 3:
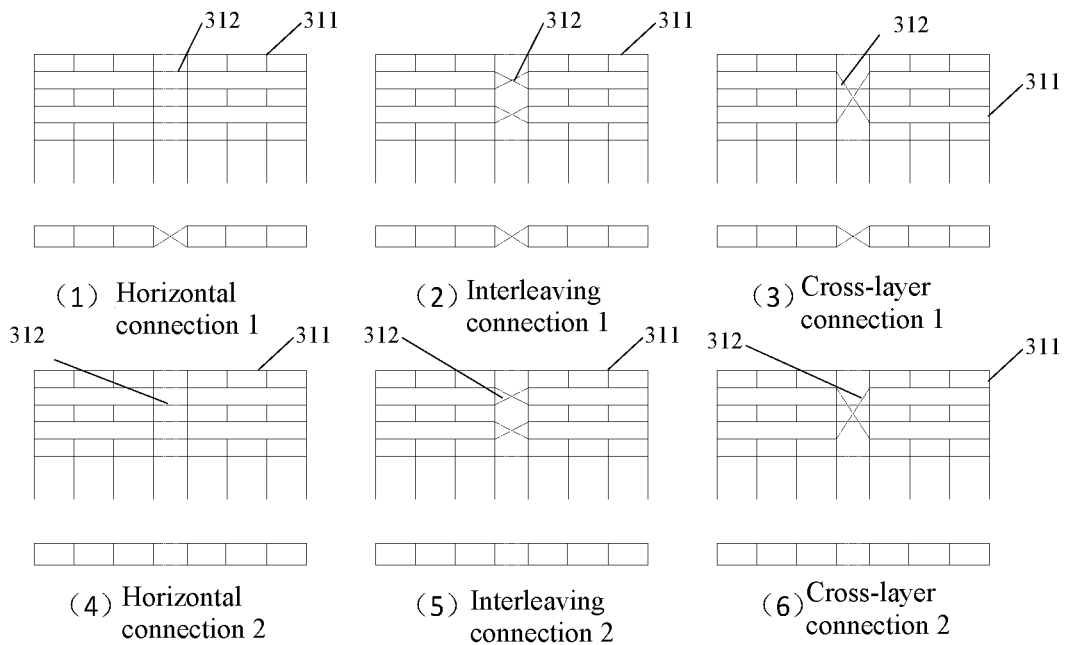
FIG. 3 is a diagram of reinforcing connection of a three-layer valve tower according to the present invention, in which the dotted lines are connecting rods.
Figure 4:
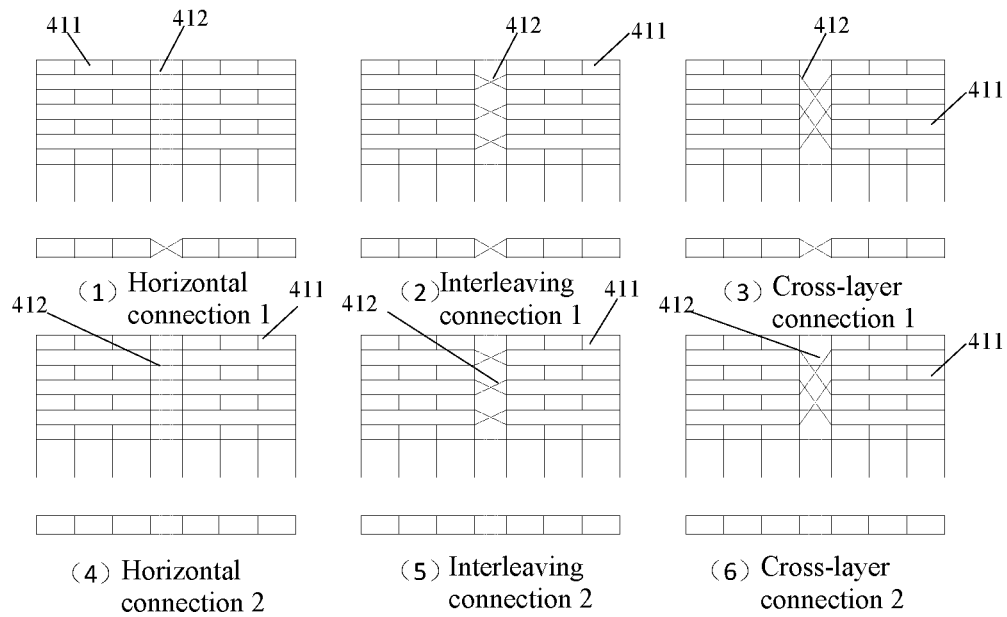
FIG. 4 is a diagram of reinforcing connection of a four-layer valve tower according to the present invention, in which the dotted lines are connecting rods.
Figure 5:
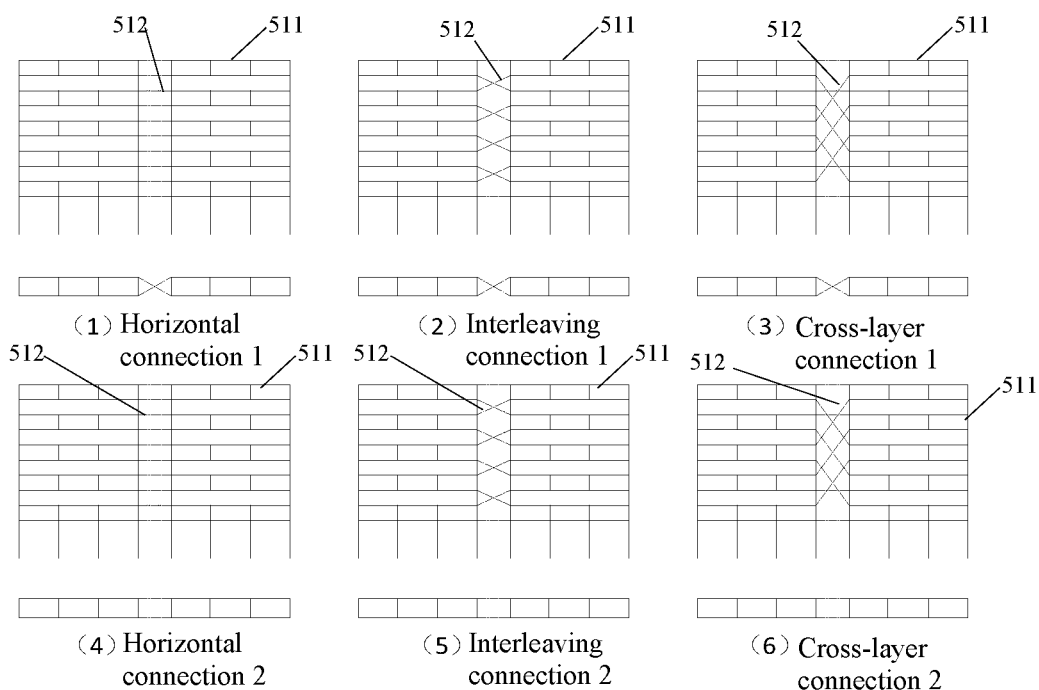
FIG. 5 is a diagram of reinforcing connection of a five-layer valve tower according to the present invention, in which the dotted lines are connecting rods.

FIGS. 3, 4 and 5 are diagrams of horizontal connection, interleaving connection and cross-layer connection of a three-layer valve tower, a four-layer valve tower and a five-layer valve tower, respectively.

Embodiment 1.1

FIGS. 3 (1, 4), FIGS. 4 (1, 4) and FIGS. 5 (1, 4) are diagrams of horizontal connection of the three-layer valve tower 311, the four-layer valve tower 411 and the five-layer valve tower 511 respectively.

The horizontal connection means that the connecting flanges at corresponding heights of corresponding layers of valve sections of adjacent valve towers are connected to each other, and each of the connecting rods 312, 412, and 512 is horizontal.

As shown in the top views at the lower parts of FIGS. 3 (1, 4), FIGS. 4 (1, 4) and FIGS. 5 (1, 4), in the horizontal connection mode, the connecting flanges at corresponding heights of the corresponding layers of valve sections of adjacent valve towers can be located on the same side or on different sides.

Embodiment 1.2

FIGS. 3 (2, 5), FIGS. 4 (2, 5) and FIGS. 5 (2, 5) are diagrams of interleaving connection of the three-layer valve tower 311, the four-layer valve tower 411 and the five-layer valve tower 511 respectively.

The interleaving connection means that for each two adjacent valve towers, two connecting flanges at the bottom of one side of one layer of valve section on one of the two adjacent valve towers are connected with two connecting flanges at the top of the corresponding side of a next layer of valve section on the other valve tower.

As shown in the top views at the lower parts of FIGS. 3 (2, 5), FIGS. 4 (2, 5) and FIGS. 5 (2, 5), in the interleaving connection mode, the connecting flanges at the top of the uppermost layer of valve section of a valve tower are connected with corresponding connecting flanges at the bottom of the lowermost layer of valve section of an adjacent valve tower by horizontal connection, either on the same side or on different sides.

Embodiment 1.3

FIGS. 3 (3, 6), FIGS. 4 (3, 6) and FIGS. 5 (3, 6) are diagrams of cross-layer connection of the three-layer valve tower 311, the four-layer valve tower 411 and the five-layer valve tower 511 respectively.

The cross-layer connection means that for each two adjacent valve towers, two connecting flanges at the bottom of one side of one layer of valve section on one of said two adjacent valve towers are connected with two connecting flanges at the top of the corresponding side of the one below a next layer of valve section on the other of said two adjacent valve towers.

As shown in the top views at the lower parts of FIGS. 3 (3, 6), FIGS. 4 (3, 6) and FIGS. 5 (3, 6), in the cross-layer connection mode, the connecting flanges at the top of the uppermost layer of valve section of a valve tower are connected with corresponding connecting flanges at the bottom of the lowermost layer of valve section of an adjacent valve tower, and the connecting flanges without corresponding connecting points across the layers are connected by horizontal connection, either on the same side or on different sides.

In Embodiment 1.3, the situation that no corresponding connecting points can be found across layers refers to the situation that when adjacent valve towers with more than three layers of valve sections are connected, the second layer counted from top to bottom is connected across layers upwards or the second layer counted from bottom to top is connected across layers downwards.

Embodiment 2

Figure 6:
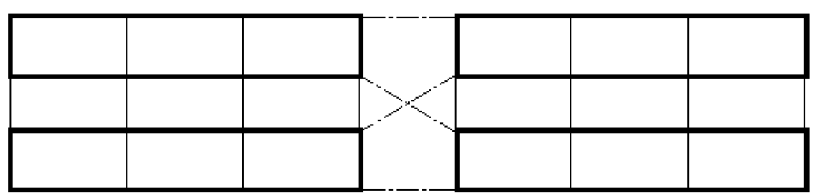
FIG. 6 is a top view of connection of back-to-back valve towers according to the present invention, in which the dotted lines are connecting rods.

FIG. 6 is a top view of lateral connection of adjacent back-to-back double-row valve towers.

In the figure, the thick line frames are the valve towers, the back sides of the back-to-back double-row valve towers are connected by copper bars, and the dotted lines are the connecting rods.

The present embodiment is a lateral connection reinforcing structure of the adjacent back-to-back double-row valve towers, wherein the inner connecting flanges are horizontally cross-connected by the connecting rods, that is, the inner connecting flange on the right side of the left back-to-back valve tower is connected with the inner connecting flange on the left side of the right back-to-back valve tower, and the connecting rods cross horizontally, which is equivalent to the different-side connection between the topmost and bottommost connecting flanges of single-row valve towers. The outer connecting flanges are connected horizontally on the same side through the connecting rods, that is, the outer connecting flange on the right side of the left back-to-back valve tower is connected with the corresponding outer connecting flange on the left side of the right back-to-back valve tower.

In the present embodiment, the usage of left side, right side, inner side and outer side are only for a convenient description, and is not a limitation on the technical solution of the present invention.

The above embodiments mainly describe lateral connection reinforcing in terms of the connection between adjacent valve towers, but in actual transportation or under special working conditions, the connection reinforcing of the adjacent valve towers can also be carried out in the front-back direction if necessary, i.e., the longitudinal direction, which is not limited by the present invention.

The above embodiments are only preferred ones of the present invention, and are not intended to limit the scope of protection of the present invention. Within the technical scope disclosed by the present invention, any technical solution for connection reinforcing of the valve towers through the cooperation of the connecting flanges and the connecting rods according to the present invention, as well as solutions of equivalent substitutions or changes proposed by anyone skilled in the art, should also fall within the scope of protection of the present invention.

What is claimed is:

1. A reinforcing structure for valve towers, each of the valve towers comprising a plurality of layers of valve sections, and the reinforcing structure comprising:
   a plurality of connecting flanges being arranged at four top corners of side faces of the layers of valve sections, respectively; and
   connecting rods, two ends of each said connecting rod being connected to the connecting flanges on adjacent valve towers respectively, so as to reinforce the adjacent valve towers;
   wherein, the adjacent valve towers are connected by horizontal connection, and cross-layer connection;
   wherein, the horizontal connection is that the connecting flanges at corresponding heights of corresponding layers of valve sections of the adjacent valve towers are connected to each other, either on same side or on different sides, and each of the connecting rods is horizontal;
   wherein, the cross-layer connection is that for each two adjacent valve towers, two connecting flanges at a bottom of one side of one layer of valve section on one of said two adjacent valve towers are connected with two connecting flanges at a top of the corresponding side of the one below a next layer of valve section on the other of said two adjacent valve towers;
   wherein, the connecting flanges at a top of an uppermost layer of valve section of a valve tower are connected with corresponding connecting flanges at a bottom of a lowermost layer of valve section of an adjacent valve tower, and the connecting flanges without corresponding connecting points across the layers are connected by the horizontal connection.

2. The reinforcing structure for the valve towers according to claim 1, wherein the valve towers are two rows of valve towers arranged in a back-to-back mirror symmetry manner.

3. The reinforcing structure for the valve towers according to claim 1, wherein the connecting rods are compressive or tensile.

4. A method for reinforcing valve towers, each of the valve towers comprising a plurality of layers of valve sections, and the method comprising:
   arranging connecting flanges at top corners of each layer of valve sections of adjacent valve towers; and
   connecting the connecting flanges on the adjacent valve towers through connecting rods;
   wherein, the adjacent valve towers are connected by horizontal connection, and cross-layer connection;
   wherein, the horizontal connection is that the connecting flanges at corresponding heights of corresponding layers of valve sections of the adjacent valve towers are connected to each other, either on same side or on different sides, and each of the connecting rods are horizontal;
   wherein, the cross-layer connection is that for each two adjacent valve towers, two connecting flanges at a bottom of one side of one layer of valve section on one of said two adjacent valve towers are connected with two connecting flanges at a top of the corresponding side of the one below a next layer of valve section on the other of said two adjacent valve towers;
   wherein, the connecting flanges at a top of an uppermost layer of valve section of a valve tower are connected with corresponding connecting flanges at a bottom of a lowermost layer of valve section of an adjacent valve tower, and the connecting flanges without corresponding connecting points across the layers are connected by the horizontal connection.

* * * * *